United States Patent
Hsu et al.

(10) Patent No.: US 7,295,082 B2
(45) Date of Patent: Nov. 13, 2007

(54) PULSE FREQUENCY MODULATION OSCILLATING CIRCUIT FOR A DC/DC CONVERTER

(75) Inventors: Hui-Yuan Hsu, Hsinchu (TW); Ching-Ju Lin, Hsinchu (TW)

(73) Assignee: Weltrend Semiconductor Inc., Hsinchu (TW)

( * ) Notice: Subject to any disclaimer, the term of this patent is extended or adjusted under 35 U.S.C. 154(b) by 16 days.

(21) Appl. No.: 11/426,578

(22) Filed: Jun. 26, 2006

(65) Prior Publication Data

US 2007/0210844 A1    Sep. 13, 2007

(30) Foreign Application Priority Data

Mar. 10, 2006    (TW) ............... 95108167 A

(51) Int. Cl.
*H03K 7/04*    (2006.01)
(52) U.S. Cl. ..................... 332/112; 375/239
(58) Field of Classification Search .............. None
See application file for complete search history.

(56) References Cited

U.S. PATENT DOCUMENTS

| | | | |
|---|---|---|---|
| 3,944,949 A * | 3/1976 | Herzog .................. 332/112 |
| 5,801,518 A * | 9/1998 | Ozaki et al. ............ 323/222 |
| 6,504,349 B2 * | 1/2003 | Jaworski ................. 323/280 |
| 6,611,132 B2 * | 8/2003 | Nakagawa et al. ...... 323/284 |
| 6,678,178 B2 * | 1/2004 | Lipcsei ................... 363/98 |
| 6,798,262 B2 | 9/2004 | Zhang | |
| 2007/0145961 A1 * | 6/2007 | Hasegawa et al. ...... 323/282 |

* cited by examiner

*Primary Examiner*—Cassandra Cox
(74) *Attorney, Agent, or Firm*—Winston Hsu

(57) ABSTRACT

A pulse frequency modulation oscillating circuit includes a reference voltage generator for generating a first reference voltage and a second reference voltage, a first comparison circuit for comparing a state signal with the first reference voltage, a second comparison circuit for comparing the state signal with the second reference voltage, an output circuit for outputting a pulse frequency modulation signal according to an under-voltage signal, and signals outputted from the first comparison circuit and from the second comparison circuit, a mode generation circuit for generating the state signal, and a mode decision circuit for outputting inverse signals of the signals outputted from the first comparison circuit or signals outputted from the output circuit to the mode generation circuit according to the pulse frequency modulation signal, the under-voltage signal, and the signals outputted from the first comparison circuit and from the second comparison circuit.

16 Claims, 5 Drawing Sheets

PULSE FREQUENCY MODULATION OSCILLATING CIRCUIT FOR A DC/DC CONVERTER

BACKGROUND OF THE INVENTION

1. Field of the Invention

The present invention provides a pulse frequency modulation oscillating circuit, and more particularly, a pulse frequency modulation oscillating circuit free from noise interference, and capable of stably controlling a DC/DC converter.

2. Description of the Prior Art

In general, an electric device is composed of a variety of units. Each unit may be operated under a unique voltage level. Therefore, the electric device must include a DC (direct current) to DC voltage transformation circuit for generating expected voltage levels. According to different requirements, there are different types of DC to DC converters, and all the converters are derived from step down (buck) converters and step up (boost) converters.

Please refer to FIG. 1, which illustrates a schematic diagram of a prior art step up DC to DC converter 10. The step up DC to DC converter 10 includes a voltage source 100, an inductor 102, a switching transistor 104, a diode 106, a control circuit 108, a capacitor 110, and a load resistor 112. According to a voltage level outputted from diode 106, the control circuit 108 controls the switching transistor 104, so as to raise voltage Vin provided by the voltage source 100 to an expected value, and outputs voltage Vout with the diode 106. The operating procedure of the step up DC to DC converter 10 is as follows. When the switching transistor 104 is turned on, the diode 106 receives an inverse bias and is turned off, so that the voltage source 100 outputs and stores energy into the inductor 102. Once the switching transistor 104 is turned off, the inductor 102 will generate voltage with an opposite polarity. That is, when the switching transistor 104 is turned on, the inductor 102 stores energy from the voltage source 100, and when the switching transistor 104 is turned off, energy stored in the inductor 102 is transferred to capacitor 110 and the load resistor 112 through the diode 106. Therefore, the control circuit 108 must precisely control the ON and OFF time of the switching transistor 104.

In the prior art, the control circuit 108 can be designed according to pulse width modulation (PWM) technology or pulse frequency modulation (PFM) technology. For example, please refer to FIG. 2, which illustrates a schematic diagram of a prior art control circuit 200. The control circuit 200 is utilized for implementing the control circuit 108 in FIG. 1, and includes a comparison circuit 202, a reference voltage generator 204, a ring oscillator 206, and resistors R1 and R2. Combination of the resistors R1 and R2 is a voltage divider for transforming the voltage Vout outputted from the diode 106 into voltage Vfb for the comparison circuit 202. The comparison circuit 202 compares the voltage Vfb with a reference voltage Vref outputted from the reference voltage generator 204. According to an under-voltage signal Vcom outputted from the comparison circuit 202, the ring oscillator 206 outputs a control signal Vext to control the switching transistor 104. If the voltage Vout is lower than a target voltage level, then the voltage Vfb is smaller than the voltage Vref, the under-voltage signal Vcom becomes a high level voltage and enables the ring oscillator 206, and the control signal Vext becomes a period pulse signal to switch on and off the switching transistor 104 in turn. Oppositely, if the voltage Vout is greater than the target voltage level, then the voltage Vfb is greater than the voltage Vref, the under-voltage signal Vcom is low and turns off the ring oscillator, and the control signal Vext is also low and turns off the switching transistor 104. In such case, if the voltage Vfb is close to the voltage Vref, the under-voltage signal Vcom is quickly switched between high and low, causing the ON and OFF time of the switching transistor 104 to be too short or unstable, which generates large ripples within the voltage Vout and decreases efficiency of voltage transformation.

To improve such problem, U.S. Pat. No. 6,798,262 discloses a control circuit, which adds an OR gate into the control circuit 200 to perform an OR operation for outputting signals of the comparison circuit 202 and the ring oscillator 206, and outputting a result to the ring oscillator 206. As a result, after the signal Vext becomes high, the signal Vext must stay high for a predetermined time, and then it can be low. However, considering a situation in which the signal Vext is low, and the voltage Vfb is suddenly lower than the voltage Vref, this causes the signal Vext to be high for the predetermined time, thus the off time of the switching transistor 104 is too short, which limits the application of U.S. Pat. No. 6,798,262.

SUMMARY OF THE INVENTION

It is therefore a primary objective of the claimed invention to provide a pulse frequency modulation oscillating circuit of a DC/DC converter.

According to the claimed invention, a pulse frequency modulation oscillating circuit comprises a reference voltage generator for generating a first reference voltage and a second reference voltage, a first comparison circuit for comparing a state signal with the first reference voltage, a second comparison circuit for comparing the state signal with the second reference voltage, an output circuit for outputting a pulse frequency modulation signal according to an under-voltage signal and signals outputted from the first comparison circuit and from the second comparison circuit, a mode generation circuit for generating the state signal, and a mode decision circuit for outputting inverse signals of the signals outputted from the first comparison circuit or signals outputted from the output circuit to the mode generation circuit according to the pulse frequency modulation signal, the under-voltage signal, and the signals outputted from the first comparison circuit and from the second comparison circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
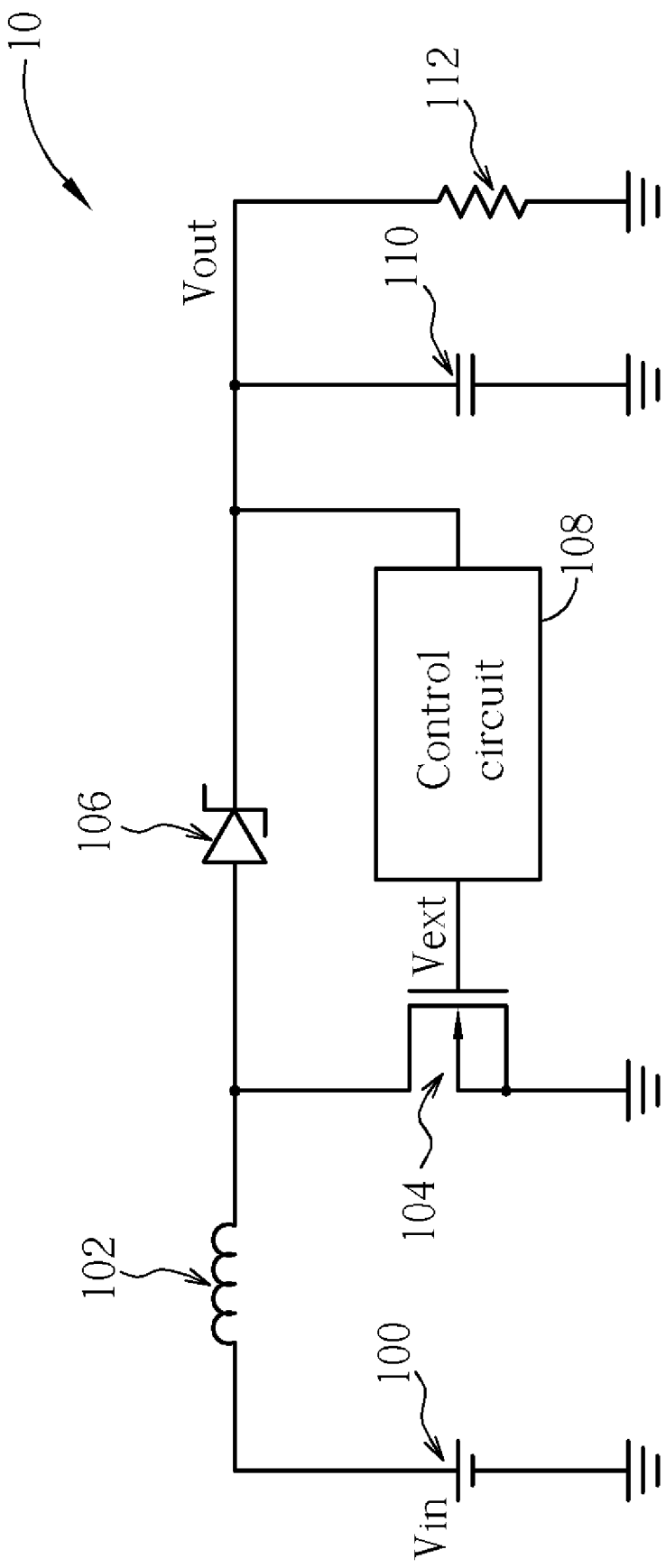
FIG. 1 illustrates a schematic diagram of a prior art step up DC to DC converter.
Figure 2:
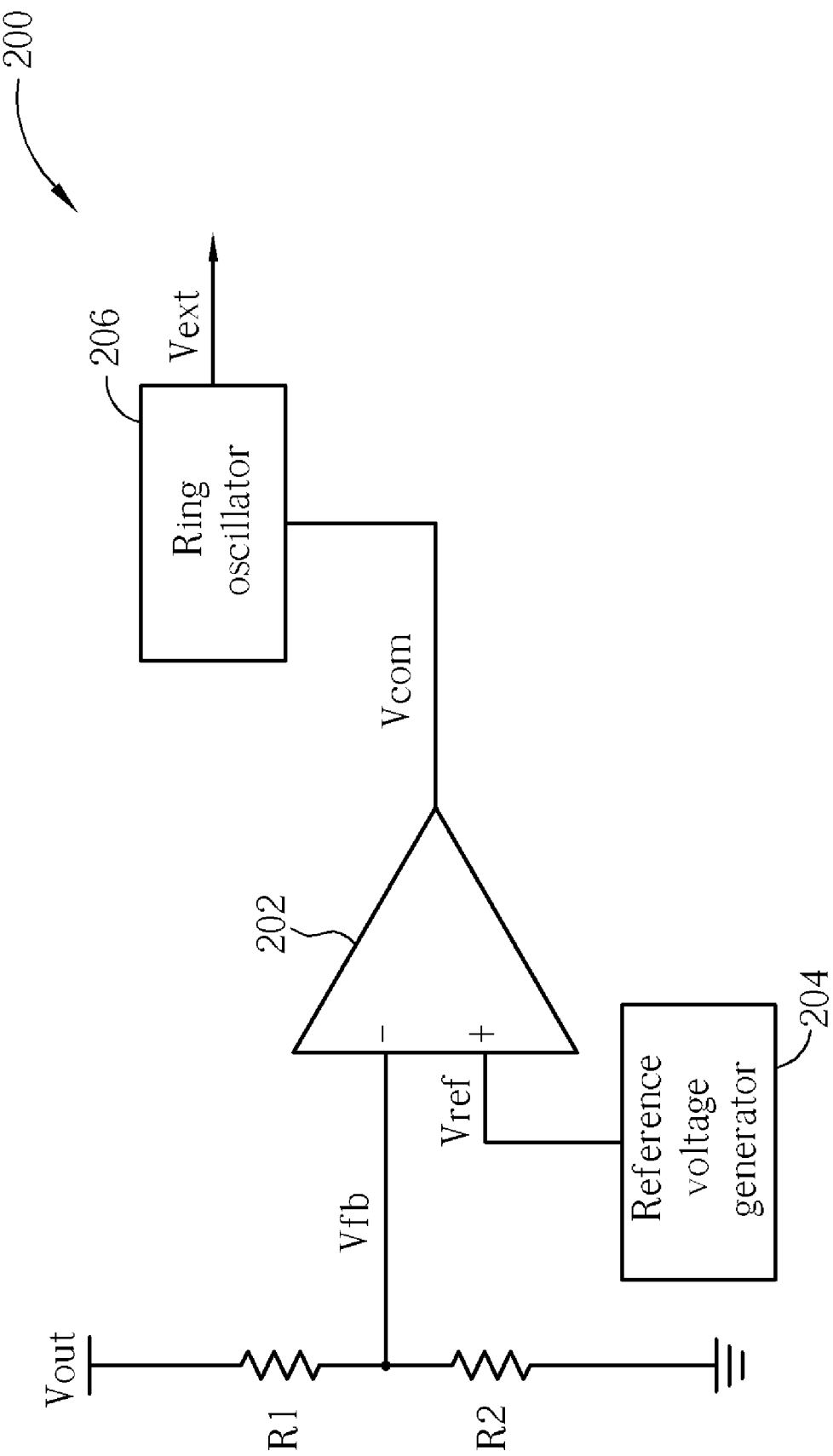
FIG. 2 illustrates a schematic diagram of a prior art control circuit.
Figure 3:
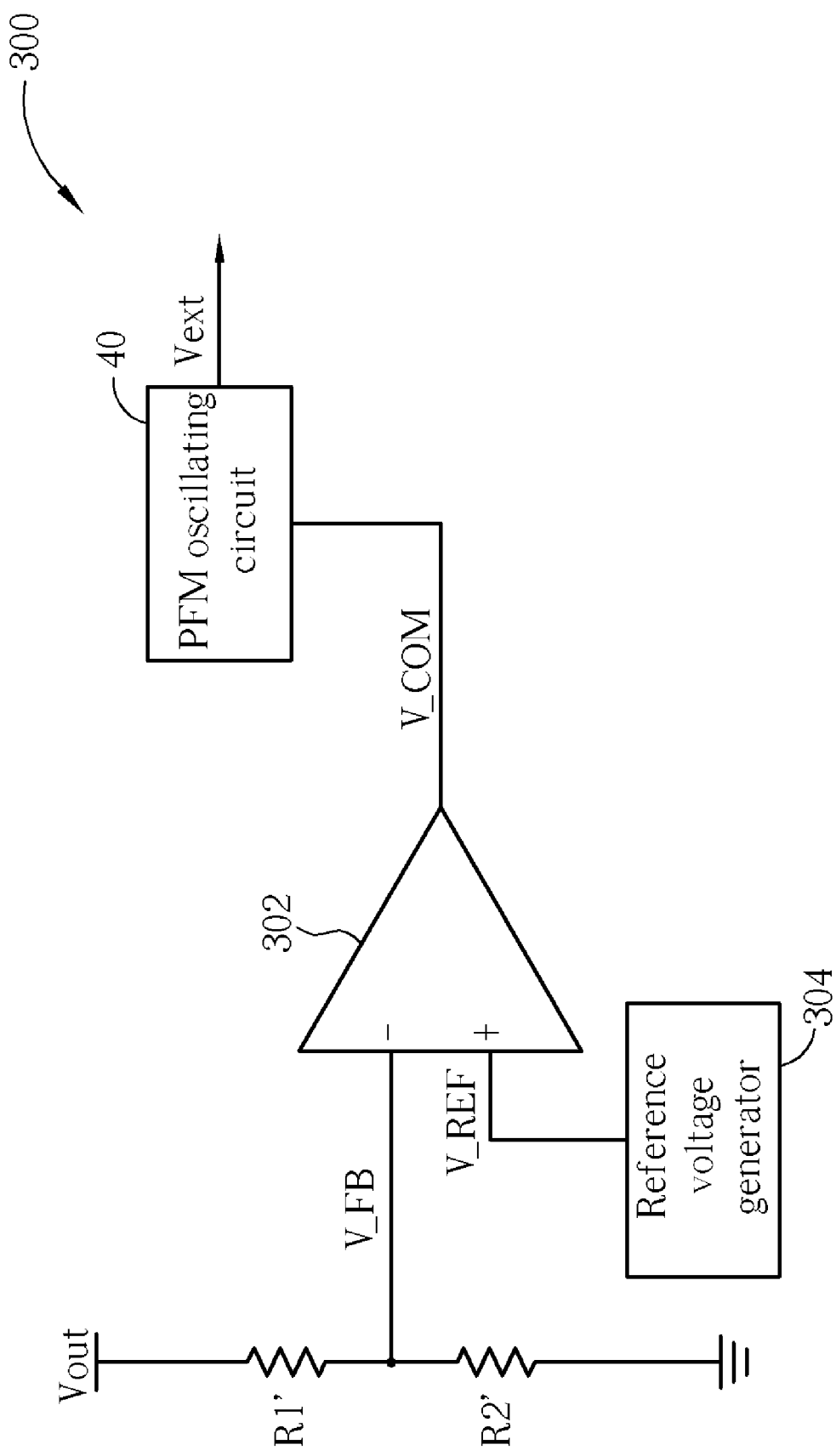
FIG. 3 illustrates a schematic diagram of a pulse frequency modulation control circuit in accordance with the present invention.

Please refer to FIG. 3, which illustrates a schematic diagram of a PFM control circuit 300 in accordance with the present invention. The PFM control circuit 300 is utilized for implementing the control circuit 108 shown in FIG. 1, and includes a comparison circuit 302, a reference voltage generator 304, a PFM oscillating circuit 40, and resistors R1' and R2'. Combination of the resistors R1' and R2' is a voltage divider for transforming the voltage Vout outputted from the diode 106 into voltage V_FB for the comparison circuit 302. The comparison circuit 302 compares the voltage V_FB with a reference voltage V_REF outputted from the reference voltage generator 304. According to signal V_COM outputted from the comparison circuit 302, the PFM oscillating circuit 40 outputs the control signal Vext to control the switching transistor 104.

Figure 4:
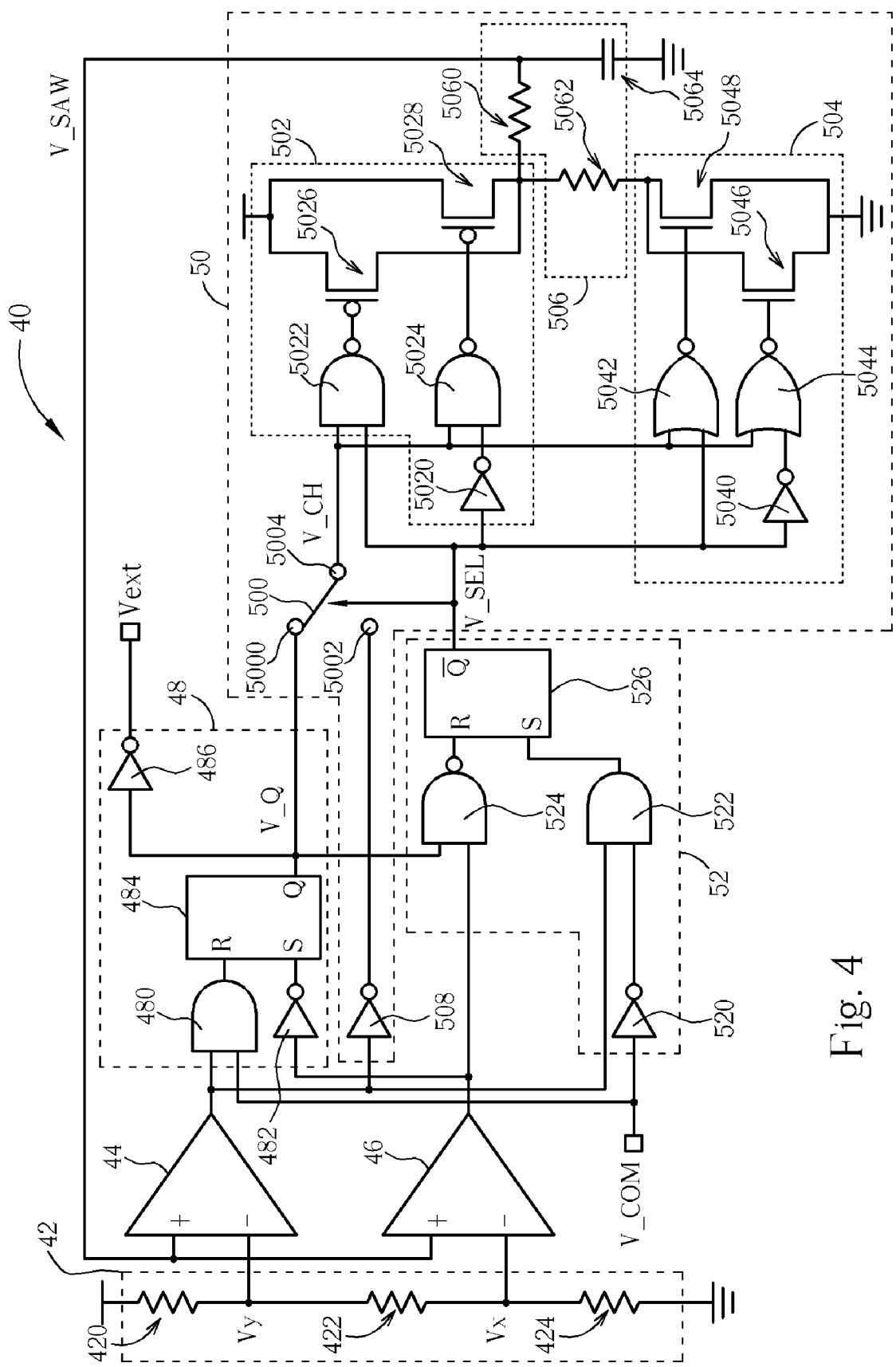
FIG. 4 illustrates a schematic diagram of a pulse frequency modulation oscillating circuit.

Please refer to FIG. 4, which illustrates a schematic diagram of the PFM oscillating circuit 40 shown in FIG. 3. The PFM oscillating circuit 40 includes a reference voltage generator 42, a first comparison circuit 44, a second comparison circuit 46, an output circuit 48, a mode generation circuit 50, and a mode decision circuit 52. The reference voltage generator 42 includes resistors 420, 422, and 424, utilized for generating divided voltages Vy and Vx to the first comparison circuit 44 and the second comparison circuit 46. The output circuit 48 outputs the PFM signal Vext to the switching transistor according to the signal V_COM and output signals of the first comparison circuit 44 and the second comparison circuit 46. The output circuit 48 includes an AND gate 480, an inverter 482, a latch circuit 484, and an inverter 486. Preferably, the latch circuit 484 is an RS flip-flop. The mode generation circuit 50 includes a switching circuit 500, a charging circuit 502, a discharging circuit 504, a voltage state circuit 506, and an inverter 508. The switching circuit 500 includes a first input terminal 5000, a second input terminal 5002, and an output terminal 5004. The charging circuit 502 includes an inverter 5020, a first NAND gate 5022, a second NAND gate 5024, a first transistor 5026, and a second transistor 5028. Preferably, the first transistor 5026 and the second transistor 5028 are p-type metal oxide semiconductor field effect transistors (MOSFETs), and a width of the first transistor 5026 is larger than that of the second transistor 5028. The discharging circuit 504 includes an inverter 5040, a first NOR gate 5042, a second NOR gate 5044, a first transistor 5046, and a second transistor 5048. Preferably, the first transistor 5046 and the second transistor 5048 are n-type MOSFETs, and a width of the first transistor 5046 is larger than that of the second transistor 5048. The voltage state circuit 506 includes a first resistor 5060, a second resistor 5062, and a capacitor 5064. The mode decision circuit 52 includes an inverter 520, a NAND gate 524, an AND gate 522, and a latch circuit 526. The latch circuit 526 is preferably a RS flip-flop.

Figure 5:
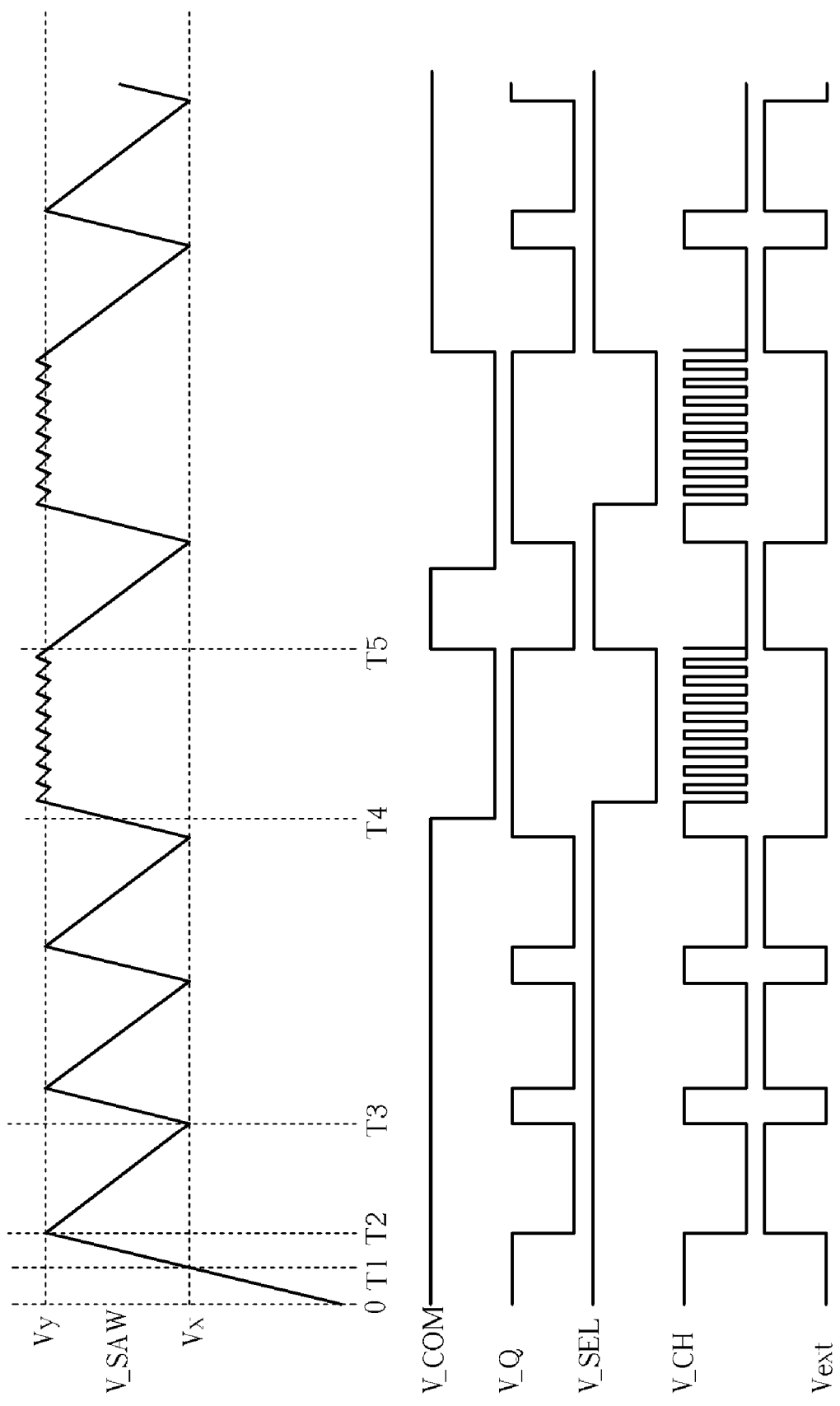
FIG. 5 illustrates a waveform diagram of signals related to operation of the pulse frequency modulation oscillating circuit shown in FIG. 4.

Please refer to FIG. 5, which illustrates a waveform diagram of signals related to operation of the PFM oscillating circuit 40. FIG. 5, from top to bottom, represents a state signal V_SAW outputted from the voltage state circuit 506, the signal V_COM inputted into the mode decision circuit 52, a signal V_Q outputted from the latch circuit 484, a signal V_SEL outputted from the latch circuit 526, a signal V_CH of the output terminal 5004 of the switching circuit 500, and the signal Vext output from the inverter 486. In an initial state, or before a time point T1, the voltage Vout is lower than the target voltage level, so that the signal V_COM is high, and the state signal V_SAW is lower the voltage Vx, causing the output signals of the first comparison circuit 44 and the second comparison circuit 46 to be low (0). Therefore, signals at terminals R and S of the latch circuit 484 are (0, 1), so that the signal V_Q is high, and the signal Vext is low with the inverter 486. Meanwhile, the high signal V_SEL controls the switching circuit 500 to form a signal route from the first input terminal 5000 to the output terminal 5004, and that is, the signal V_CH equals the signal V_Q, which turns on the first transistor 5026, and turns off the transistors 5028, 5046, and 5048. Then, drain current of the first transistor 5026 charges the capacitor 5064 through the resistor 5060. Therefore, before the time point T1, the voltage of the state signal V_SAW changes from 0 to the voltage Vx.

Next, between the time point T1 and a time point T2, the output signal of the second comparison circuit 46 becomes high. Since the voltage Vout is still lower than the target voltage, the signals V_COM and V_SEL stay high. The transistor 5026 keeps charging the capacitor 5064 until the voltage of the state signal V_SAW exceeds the voltage Vy at the time point T2. At this moment (T2) to a time point T3, the output signal of the first comparison circuit 44 changes to high, so that the signal V_Q becomes low, the transistors 5026, 5028, and 5048 are turned off, and transistor 5046 is turned on. Therefore, the transistor 5046 draws current from the capacitor 5064 through the resistors 5060 and 5062. In other words, between the time points T2 and T3, the capacitor 5064 keeps discharging until the voltage of the state signal V_SAW outputted from the capacitor 5064 is lower than the voltage Vx. At the time point T3, the output signal of the latch circuit 484 changes to high, and thus, the transistor 5026 starts to charge the capacitor 5064 again. Charging and discharging is repeated until a time point T4, when the voltage Vout exceeds the target voltage. Then, the signal V_COM becomes low, and if the voltage of the state signal V_SAW exceeds the voltage Vy, the signal V_SEL becomes low to control the switching circuit 500 to form a signal route from the second input terminal 5002 to the output terminal 5004. Therefore, the signal V_CH at the output terminal 5004 of the switching circuit 500 is the inverse of the output signal of the first comparison circuit 44. Meanwhile, since the signal V_SEL is low, the transistors 5026 and 5046 stay off. That is, charging and discharging the capacitor 5064 are performed by the transistors 5028 and 5048 having narrow widths, so that a voltage level of the state signal V_SAW can be kept around the voltage Vy. At a time point T5, the voltage Vout is lower than the target voltage level, so that the signal V_COM becomes high, and the voltage of the state signal V_SAW changes from the voltage Vy to the voltage Vx. If at this moment, the voltage V_COM changes to low owing to a shift of the voltage Vout, then the voltage V_SEL will not respond to the changing of the signal V_COM until the voltage of the state signal V_SAW is raised from the voltage Vx to the voltage Vy.

In FIG. 5, the time point T0 to T1 is a period for starting the voltage source. The time point T1 to T2 is a period of minimum OFF time, and the voltage of the state signal V_SAW changes from the voltage Vx to Vy during this period. The time point T2 to T3 is a period of fixed ON time, and the voltage of the state signal V_SAW changes from the voltage Vy to Vx during this period. That is, the ON time of the PFM oscillating circuit 40 is fixed, and the OFF time of the PFM oscillating circuit 40 is variable but has a minimum, which can prevent noise interference. Moreover, the resistors 5060 and 5062, and the capacitor 5064 decide a frequency and a duty cycle of the signal Vext. The voltages Vx and Vy can be adjusted by adjusting the resistors 420, 422, and 424. Therefore, a designer can determine the operation of the PFM oscillating circuit 40 accordingly.

In summary, the present invention uses charging and discharging of the state signal V_SAW to prevent the PFM control signal from noise interference, control the step up DC to DC converter efficiently and stably, and decrease ripples.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pulse frequency modulation oscillating circuit comprising:
    a reference voltage generator for generating a first reference voltage and a second reference voltage;
    a first comparison circuit for comparing a state signal with the first reference voltage;
    a second comparison circuit for comparing the state signal with the second reference voltage;
    an output circuit for outputting a pulse frequency modulation signal according to an under-voltage signal and signals outputted from the first comparison circuit and from the second comparison circuit;
    a mode generation circuit for generating the state signal; and
    a mode decision circuit for outputting inverse signals of the signals outputted from the first comparison circuit or signals outputted from the output circuit to the mode generation circuit according to the pulse frequency modulation signal, the under-voltage signal, and the signals outputted from the first comparison circuit and from the second comparison circuit.

2. The pulse frequency modulation oscillating circuit of claim 1, wherein the reference voltage generator comprises:
    a first resistor having a first terminal coupled to a voltage source, and a second terminal coupled to an input terminal of the first comparison circuit;
    a second resistor having a first terminal coupled to the second terminal of the first resistor, and a second terminal coupled to an input terminal of the second comparison circuit; and
    a third resistor having a first terminal coupled to the second terminal of the second resistor, and a second terminal coupled to ground.

3. The pulse frequency modulation oscillating circuit of claim 1, wherein the output circuit comprises:
    an AND gate having a first input terminal coupled to an output terminal of the first comparison circuit, a second input terminal coupled to the under-voltage signal, and an output terminal;
    an inverter coupled to an output terminal of the second comparison circuit; and
    a latch circuit having a first input terminal coupled to the output terminal of the AND gate, a second input terminal coupled to an output terminal of the inverter, and an output terminal.

4. The pulse frequency modulation oscillating circuit of claim 3, wherein the latch circuit is an RS flip-flop having a reset terminal and a set terminal corresponding to the first input terminal and the second input terminal of the latch circuit.

5. The pulse frequency modulation oscillating circuit of claim 3, wherein the output circuit further comprises an inverter coupled between the output terminal of the latch circuit and a driving transistor.

6. The pulse frequency modulation oscillating circuit of claim 1, wherein the mode generation circuit comprises:
    a switching circuit having a first input terminal, a second input terminal, and an output terminal for receiving the signals outputted from the output circuit through the first input terminal or receiving inverse signals of signals outputted from the first comparison circuit through the second input terminal according to signals outputted from the mode decision circuit;
    a charging circuit coupled to the output terminal of the switching circuit, for outputting currents according to signals outputted from the switching circuit;
    a discharging circuit coupled to the output terminal of the switching circuit, for drawing currents according to the signals outputted from the switching circuit; and
    a voltage state circuit coupled between the charging circuit and the discharging circuit, for generating the state signal.

7. The pulse frequency modulation oscillating circuit of claim 6, wherein the charging circuit comprises:
    an inverter coupled to the mode decision circuit;
    a first NAND gate having a first input terminal coupled to the output terminal of the switching circuit, a second input terminal coupled to the mode decision circuit, and an output terminal;
    a second NAND gate having a first input terminal coupled to the output terminal of the switching circuit, a second input terminal coupled to the inverter, and an output terminal;
    a first transistor having a gate terminal coupled to the output terminal of the first NAND gate, a source terminal coupled to a system voltage source, and a drain terminal coupled to voltage state circuit; and
    a second transistor having a gate terminal coupled to the output terminal of the second NAND gate, a source terminal coupled to the system voltage source, and a drain terminal coupled to the voltage state circuit.

8. The pulse frequency modulation oscillating circuit of claim 7, wherein the first transistor and the second transistor are p-type metal oxide semiconductor field effect transistors.

9. The pulse frequency modulation oscillating circuit of claim 8, wherein a width of the first transistor is larger than that of the second transistor.

10. The pulse frequency modulation oscillating circuit of claim 6, wherein the discharging circuit comprises:
    an inverter coupled to the mode decision circuit;
    a first NOR gate having a first input terminal coupled to the output terminal of the switching circuit, a second input terminal coupled to the mode decision circuit, and an output terminal;
    a second NOR gate having a first input terminal coupled to the output terminal of the switching circuit, a second input terminal coupled to the inverter, and an output terminal;
    a first transistor having a gate terminal coupled to the output terminal of the second NOR gate, a source terminal coupled to ground, and a drain terminal coupled to the voltage state circuit; and
    a second transistor having a gate terminal coupled to the output terminal of the first NOR gate, a source terminal coupled to ground, and a drain terminal coupled to the voltage state circuit.

11. The pulse frequency modulation oscillating circuit of claim 10, wherein the first transistor and the second transistor are n-type metal oxide semiconductor field effect transistors.

12. The pulse frequency modulation oscillating circuit of claim 11, wherein a width of the first transistor is larger than that of the second transistor.

13. The pulse frequency modulation oscillating circuit of claim 6, wherein the voltage state circuit comprises:
- a first resistor having a terminal coupled to the charging circuit, and the other terminal coupled to the first comparison circuit and the second comparison circuit;
- a second resistor having a terminal coupled to the charging circuit, and the other terminal coupled to the discharging circuit; and
- a capacitor having a terminal coupled to the first resistor, the first comparison circuit, and the second comparison circuit, and the other terminal coupled to ground.

14. The pulse frequency modulation oscillating circuit of claim 6, wherein the mode generation circuit further comprises an inverter between the second input terminal of the switching circuit and the output terminal of the first comparison circuit.

15. The pulse frequency modulation oscillating circuit of claim 1, wherein the mode decision circuit comprises:
- an inverter having an input terminal coupled to the under-voltage signal, and an output terminal;
- a NAND gate having a first input terminal coupled to the output terminal of the output circuit, a second input terminal coupled to the output terminal of the second comparison circuit, and an output terminal;
- an AND gate having a first input terminal coupled to the output terminal of the first comparison circuit, a second input terminal coupled to the output terminal of the inverter, and an output terminal; and
- a latch circuit having a first input terminal coupled to output terminal of the NAND gate, a second input terminal coupled to the output terminal of the AND gate, and an output terminal.

16. The pulse frequency modulation oscillating circuit of claim 15, wherein the latch circuit is an RS flip-flop having a reset terminal and a set terminal corresponding to the first input terminal and the second input terminal of the latch circuit.

* * * * *